(12) United States Patent
Razeghi

(10) Patent No.: US 6,461,884 B1
(45) Date of Patent: Oct. 8, 2002

(54) DIODE LASER

(76) Inventor: Manijeh Razeghi, 1500 Sheridan Rd., Wilmette, IL (US) 60091

( * ) Notice: Subject to any disclaimer, the term of this patent is extended or adjusted under 35 U.S.C. 154(b) by 0 days.

(21) Appl. No.: 09/755,764

(22) Filed: Jan. 5, 2001

(51) Int. Cl.$^7$ ............................................. H01L 21/20
(52) U.S. Cl. ............................ 438/22; 438/31; 438/46
(58) Field of Search ........................... 438/22, 24, 31, 438/32, 45, 46, 47, 481, 483

(56) References Cited

U.S. PATENT DOCUMENTS 4,817,110 A * 3/1989 Tokunda et al. ............... 372/45
6,177,684 B1 * 1/2001 Sugiyama ..................... 257/17
6,304,587 B1 * 10/2001 Zah ............................... 372/46

FOREIGN PATENT DOCUMENTS

JP          08204285       * 8/1996

* cited by examiner

*Primary Examiner*—Savitri Mulpuri
(74) *Attorney, Agent, or Firm*—Welsh & Katz, Ltd.

(57) ABSTRACT

Diode lasers of the formula GaInP/InGaAs on GaAs substrates with GaAlAs/GaAs waveguides which operate at powers higher than 5.3W with emitting apertures of 100 microns are disclosed. By varying compositions of the active layer and by employing strained layer quantum wells, diode lasers are fabricated over the wavelength range of 700 to 1100 nm.

29 Claims, 2 Drawing Sheets

DIODE LASER

This application relates to semiconductor III–V alloy compounds and more particularly to a method of making III–V alloy compounds for use in diode lasers.

BACKGROUND OF THE INVENTION

The growth of semiconductor III–V compounds by chemical vapor deposition (CVD) using organometallics and hydrides as elemental sources has developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures.

Open-tube flow systems are used at atmospheric or reduced pressures in producing the III–V alloys. The process requires only one high-temperature zone for the in situ formation and growth of the semiconductor compound directly on a heated substrate.

Low pressure (LP-) MOCVD growth method offers an improved thickness uniformity and compositional homogeneity, reduction of autodoping, reduction of parasitic decomposition in the gas phase, and allows the growth of high-quality material over a large surface area. The LP-MOCVD technique has been successfully used to grow $Ga_xIn_{1-x}As_yP_{1-y}$ ($0 \leq x \leq 0.47$ and $0 \leq y \leq 1$) lattice matched to InP for the complete compositional range between InP ($\lambda=0.91$ $\mu$m, $E_g=1.35$ eV) and the ternary compound $Ga_{0.47}In_{0.53}As$ ($\lambda=1.67$ $\mu$m, $E_g=0.75$ eV). GaInAsP alloys, which are potentially useful materials both for heterojunction microwave and optoelectronic device applications can be grown by liquid-phase epitaxy (LPE), molecular-beam epitaxy (MBE), conventional vapor-phase epitaxy (VPE), as well as MOCVD.

The technique of LP-MOCVD is well adapted to the growth of the entire composition range of GaInAsP layers of uniform thickness and composition that is lattice matched to GaAs over areas of more than 10 cm². This results first from the ability of the process to produce abrupt composition changes and second from the result that the composition and growth rate are generally temperature independent. It is a versatile technique, numerous starting compounds can be used, and growth is controlled by fully independent parameters.

Growth by MOCVD takes place far from a thermodynamic equilibrium, and growth rates are determined generally by the arrival rate of material at the growing surface rather than by temperature-dependent reactions between the gas and solid phases. In contrast to LPE growth, it has been found that during MOCVD growth of a double heterostructure, GaAs can be grown directly on GaInAsP with no disturbance of the active layer, i.e., there is no effect equivalent to melt-back. One of the key reasons for the usefulness of this method is the possibility of obtaining high-purity and therefore high-mobility $Ga_xIn_{1-x}As_yP_{1-y}$. As long-wavelength 1.0–1.65 $\mu$m GaInAsP electro-optical devices become more widely used, motivated by low fiber absorption and dispersion, high transmission through water and smoke, and greatly enhanced eye safety at wavelengths greater than 1.4 $\mu$m, LP-MOCVD offers the advantages of smooth uniform surfaces, sharp interfaces (lower than 5 Å for GaInAsP/GaAs), uniformly lower background doping density, and economy of scale for large-area devices.

Recent studies have shown the feasibility of using InGaAsP/GaAs heterostructures as diode lasers. The diodes can be used successfully for solid state laser pumping and can be interchanged with lasers based on AlGaAs/GaAs heterostructures.

SUMMARY OF THE INVENTION

A feature, therefore, of the invention is the growth of high quality $Ga_xIn_{1-x}As_yP_{1-y}$ ($\lambda$ between 700 up to 1100 nm)= 808 nm)/GaAs GRIN-SCH (Graded Index Separate Confinement) double heterostructures by either low-pressure metallorganic chemical vapor deposition (LP-MOCVD) or gas source MBE.

A further feature of the subject invention is a double heterojunction laser structure grown with strained layer quantum wells.

A still further feature of the subject invention is a method of controlling the wavelength range and energy gap of the diode laser by varying both the composition of the strained layer quantum wells.

Another feature of the subject invention is a method of changing the wavelength by changing the Ga, In, Al P and As sources to vary the composition of the resulting heterojunction composition.

A still further features of the subject invention is a method of doping a contact layer of a heterostructure for use in a diode laser so as to include a high volume percentage of dopant atoms in the surface.

These and other features are attained by the subject invention wherein SCH-SQW (separate confinement heterostructure, single quantum well) diode lasers of the formula GaInP/InGaAsP on GaAs substrates with waveguides of AlGaAs, operating at powers higher than 5W with emitting apertures of 100 microns are prepared. By varying compositions and by employing strained layer quantum wells, InGaAsP diode lasers can be fabricated over the wavelength range of 700 to 1100 nm.

DETAILED DESCRIPTION OF DRAWINGS

Figure 2:
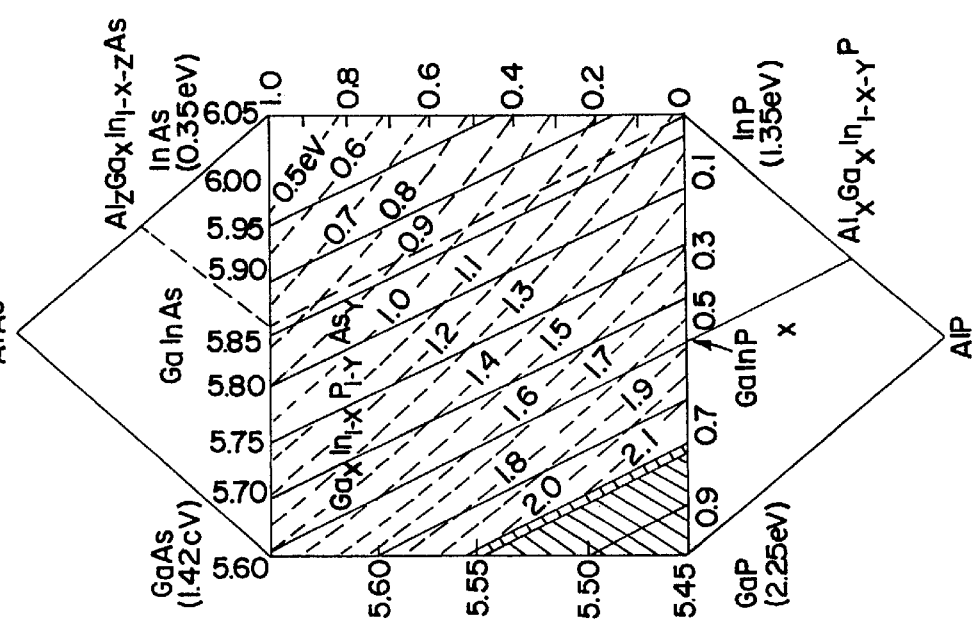
FIG. 2 is a schematic diagram of the LP-MOCVD reactor for use in the method of the subject invention.

The reactor and associated gas-distribution scheme for use herein are shown in FIG. 2. The system consists of a cooled quartz reaction tube (diameter 5 cm in the substrate area) and is pumped by a high-capacity roughing pump (120 hr$^{-1}$) to a vacuum between 10 and 300 Torr. The substrate is mounted on a pyrolytically coated graphite susceptor that is heated by rf induction at 1 MHz. The pressure inside the reactor is measured by a mechanical gauge and the temperature by an infrared pyrometer. A molecular sieve is used to impede oil back-diffusion at the input of the pump. The working pressure is adjusted by varying the flow rate of the pump by using a control gate valve. The gas panel is classical, using ¼-inch stainless steel tubes and Swagelock fittings. Flow rates are controlled by mass flowmeters.

The reactor is purged with a nitrogen flow of 4 liters min$^{-1}$, and the working pressure of 75 Torr is established by opening the gate valve that separates the pump and the reactor. The evacuation line that is used at atmospheric pressure is automatically closed by the opening of the gate valve. The gas flow rates are measured under standard conditions, i.e., 1 atm and 20° C., even when the reactor is at subatmospheric pressure. The pressure in the gas panel is regulated by a needle valve placed between the gas panel and the reactor. The needle valve is adjusted to maintain a constant pressure of 1 atm on the gas panel, thereby ensuring reproducibility of flow-rate measurements.

The gas sources for use in the growth of GaInAsP by LP-MOCVD are listed in the accompanying tabulation. The organometallic

| Group-III Sources | Group-V Sources |
|---|---|
| $Ga(C_2H_5)_3$ | $AsH_3$ |
| $In(CH_3)_3$ | $PH_3$ |
| $Al(CH_3)_3$ | |
| $Al(CH_2CH_3)_3$ | | group-III species trimethyl indium (TMI) and triethyl gallium (TEG) are contained in stainless steel bubblers, which are held in controlled temperature baths at 31 and 0 C., respectively. An accurately metered flow of purified $H_2$ for TMI and TEG is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure and diluted arsine ($AsH_3$) and pure phosphine ($PH_3$) are used as sources of As and P, respectively. The metal alkyl or hydride flow can be either injected into the reactor or into the waste line by using two-way valves. In each case, the source flow is first switched into the waste line to establish the flow rate and then switched into the reactor. The total gas flow rate is 8 liters $min^{-1}$. Stable flows are achieved by the use of mass flow controllers.

Semi-insulating or $n^+$ substrates are supplied by MCP, Crystacomm, Metals Research, or Sumitomo in the form of ingots or polished wafers. Wafers are sliced 2° off (100) toward ( 10) and chemically etched for 10 seconds at room temperature in a 15% bromine-methanol solution in order to remove 20 $\mu$m from each side. The wafers are then mechanochemically polished in a solution of 1.5% bromine in methanol, removing a further 80–100 $\mu$m. The substrates are finally cleaned in methanol and rinsed in isopropyl alcohol. The substrates are etched again, just before use, by dipping in 1% bromine in methanol at room temperature for one minute, rinsing in warm isopropyl alcohol, and drying. An $n^+$ tin-doped substrate and a semi-insulating iron-doped substrate are generally used for each experiment.

A. Dopants usable in the method of the subject invention are as follows:

| n dopant | p dopant |
|---|---|
| $H_2Se$ | $(CH_3)_2Zn$ |
| $H_2S$ | $(C_2H_5)_2$ Zn |
| $(CH_3)_3Sn$ | $(C_2H_5)_2$ Be |
| $(C_2H_5)_3Sn$ | $(CH_3)_2Cd$ |
| $SiH_4$ | $(C_2H_5)_2Mg$ |
| $Si_2H_6$ | $Cp_2Mg$ |
| $GeH_4$ | |

The substrate can be GaAs, Si, $Al_2O_3$, MgO, SiC, ZnO, $LiGaO_2$, $LiAdO_2$, $MgAl_2O_4$ or GaN. Preferably, GaAs is used as the substrate.

The epitaxial layer quality is sensitive to the pretreatment of the substrate and the alloy composition. Pretreatment of the substrates prior to epitaxial growth is thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_1O$, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species but is independent of temperature between 500 and 600° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

High quality GaInAsP/GaAs may be grown in the method of the subject invention by low pressure metallorganic chemical vapor deposition (LP-MOCVD). The layers of the heterostructure are grown in a induction-heated horizontal cool wall reactor, as described below in more detail. Trimethylindium (TMI) and triethylgallium (TEG) are used as the sources of Indium and Gallium. Pure and diluted arsine ($AsH_3$) and phosphine ($PH_3$) supplied by Matheson Inc. are used as As and P sources. Sample is grown on a (001) GaAs substrate with 2 degree Disorientation toward <110>, thus giving rise to a strained layer quantum well. The optimum growth conditions are listed in Table 1.

Other forms of deposition of III–V films such as the subject invention, may be used as well including MBE (molecular beam epitaxy), MOMBE (metalorganic molecular beam epitaxy), LPE (liquid phase epitaxy, VPE (vapor phase epitaxy) or gas source MBE.

Figure 1:
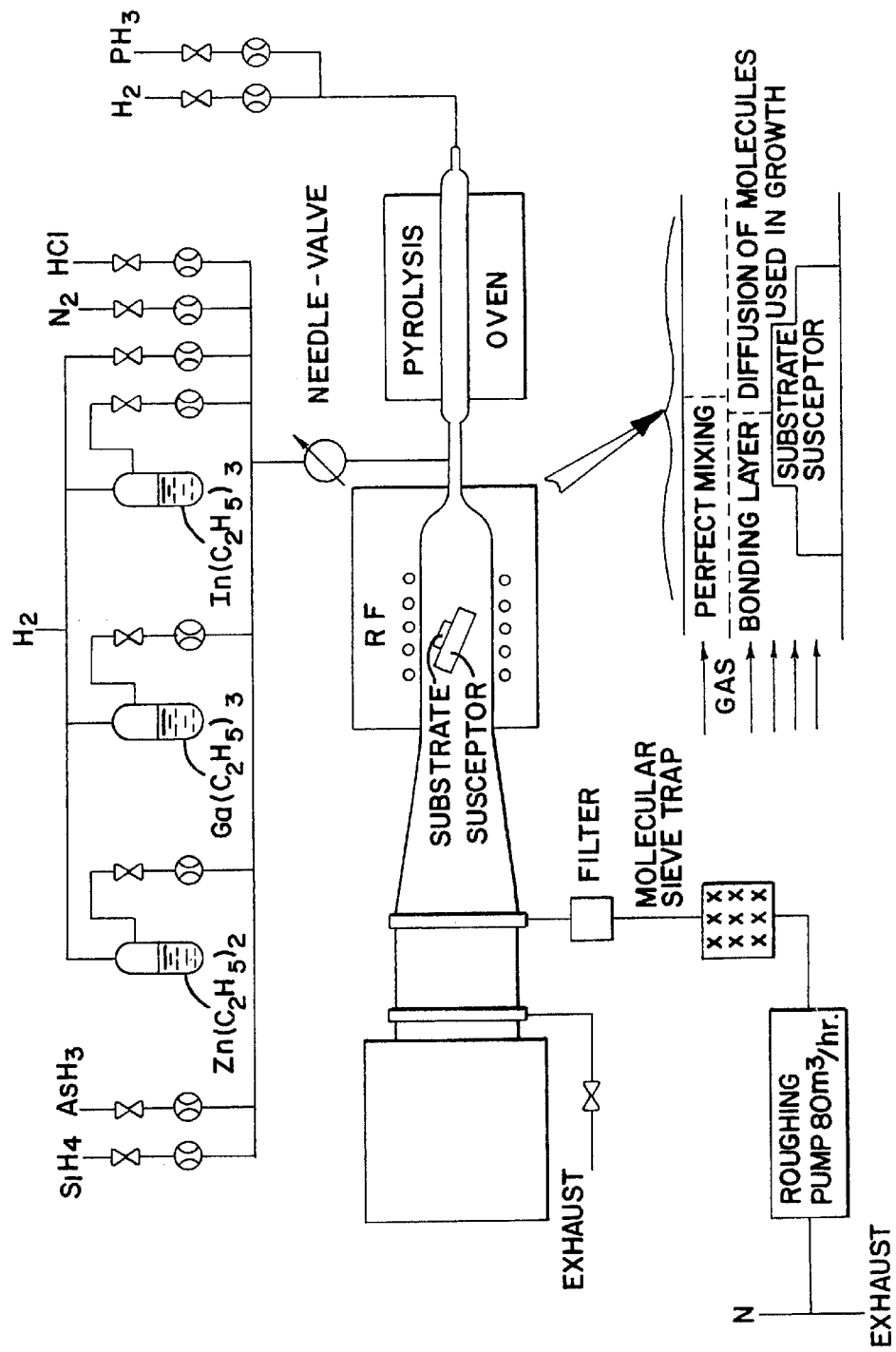
FIG. 1 is a plot of the compositional plane for quaternary III–V alloys matched to an InP substrate.

Doping is preferably conducted with diethyl zinc (DEZ) Diethyl Beryllium (DEBe) for p-type doping and silane ($SiH_4$) for n-type doping. Doping is performed through a bubbler in FIG. 1 with $H_2$ as carrier gas and at temperatures from −15° C. to ambient temperatures at 20–90 $cm^3$ $min.^{-1}$ and onto either a hot or cooled substrate (535° C.). $SiH_4$ or $H_2S$ may be simply directed at ambient temperatures onto the hot substrate at 20–90 $cm^3$ $min.^{-1}$.

In a preferred doping method for incorporating the maximum amount of dopant on the layer, once the layer to be doped is fully grown, the heat source is terminated and the substrate allowed to cool; the metal and hydride sources are terminated; the dopant flow, for instance DEZ, is initiated at the temperatures indicated for diffusion onto the cooled substrate/epilayer which has been previously grown. After about 2–3 minutes, the dopant flow is terminated and the next epilayer grown. By this method, it is found that $10^{20}$ atoms of Zn may be placed on the top surface of the epilayer.

TABLE 1

Optimum growth conditions of GaInP/GaInAsP/GaInP/GaAs structure.

|  | GaAs | AlGaAs | GaInP | GaInAsP |
|---|---|---|---|---|
| Growth Pressure (Torr) | 76 | 76 | 76 | 76 |
| Growth Temperature (° C.) | 535 | 535 | 535 | 535 |
| Total $H_2$ Flow (liter/min) | 3 | 3 | 3 | 3 |
| $AsH_3$ (cc/min) | 30 | 30 | — | 20 |
| TMI (cc/min) | — | — | 200 | 150 |
| TEG (cc/min) | 120 | 120 | 120 | 120 |
| $PH_3$ (cc/min) | — | — | 300 | 200 |
| $Al(CH_3I_3)$ | — | 50 | — | — |
| Growth Rate (Å/min) | 150 | — | 300 | 250 |

The GaAs layers can be grown at 76 Torr and low temperature, between 500 and 600° C., by using TEG and arsine ($AsH_3$) in a $H_2$ or $N_2$ or $H_2+N_2$ carrier gas.

Layers of InGaP can be grown at 76 Torr and low temperature, between 500 and 600° C., using TEI or TMI, TEG, and $ASH_3$ in an $H_2$ or $N_2$ or $H_2+N_2$ carrier gas. Uniform composition $In_{0.49}Ga_{0.51}P$:Zn over an area of 10 $cm^2$ of GaAs substrate has been obtained. GaAs-InGaP interfaces can be obtained by turning off the arsine flow and turning on both the TMI and the $PH_3$. InGaP-GaAs interfaces can be obtained by turning off the $PH_3$ and TMI flow and turning on the AsH3 flow. The growth rate is small (5 Å $sec^{-1}$), and it takes less than 1 second for a gas flow to reach its new steady state.

The thickness of an epilayer is measured by a bevel stain technique (solution) and the composition calculated either from the PL wavelength or from the value of the lattice parameter as measured by single-crystal x-ray diffraction. The waveguide layers and active layers of InGaAsP are grown as follows.

For GaInAsP ($\lambda$=1.3 $\mu$m), one obtains the ratio of partial pressure of $$P_p/P_{As}=(1-y)/y\ 20,\ P_{In}/P_{Ga}=(1-x)/x\ 3,\ P_{(As+P)}/P_{(In+Ga)}\ 600.$$

Thus, with a growth temperature of 650° C. and total flow rate of 7 liters $min^{-1}$, one can obtain $Ga_xIn_{1-x}As_yP_{1-y}$ epitaxial layers with different compositions between GaAs (x=0, y=0) and GaInAs (x=0.47, y=1).

After optimization of growth conditions for GaAs and InGaAsP layers, LP-MOCVD has been successfully used for the growth of GaInAsP/GaAs double heterostructure layers for laser application emitting at 1.3 and 1.5 $\mu$m. The various interfaces were produced by controlling the flow of the relevant component, as in the case of GaInAs mentioned previously.

The growth rate for these quaternary materials is small (as was the case for the ternary materials)(~3 Å $sec^{-1}$), and the gas flow stabilized to its new steady-stable value in less than 1 second after switching. The thickness of the quaternary layers varied from 300 Å–1.0 $\mu$m, as follows.

Wafers grown as set forth above are lapped to a thickness of 100 $\mu$m and Au—12% Ge and Au 8% Zn contact metallizations are deposited on the n and p sides, respectively. The contacts are then annealed at 400° C. for 5 minutes in an argon ambient. The devices are cleaved and sawn, producing chips of width 150 $\mu$m with cavity lengths in the range 300–1000 $\mu$m. The laser chips are tested, unmounted under pulsed conditions at a pulse repetition rate of 104 Hz with a pulse length of 100 nsec. For chips cleaved from the same bar, the standard deviation in the lasing threshold current density is only 5%. For a large slice area (10 $cm^2$), the standard deviation in lasing threshold is typically less than 20%.

EXAMPLE 1

A GRIN-SCH heterostructure for a diode laser is prepared on a GaAs substrate according to the above methods and with the following structure. First, a highly p-dope GaAs cap layer lays on a 2-$\mu$m thick InGaP diode (n=1×$10^{18}$) confinement layer doped with Si; a 0.5 $\mu$m waveguide layer of AlGaAs/GaAs, and a 0.2-$\mu$m thick undoped biAs/GaAs active layer (1.55 $\mu$m wavelength composition), over a 0.5-$\mu$m-thick undoped GaAlAs/GaAs waveguide layer (1.3-$\mu$m wavelength composition) over a p-doped GaInP confinement layer are successively grown by LP-MOCVD on a Si-doped (100) 2° off GaAs substrate. The growth temperature is 650° C. Corrugations with a period of $\Lambda$=4600 Å[$\Lambda$=($\lambda$L/2$n_e$), where $\lambda$ is the lasing wavelength and $n_e$ the effective refractive index], (second-order grating) are formed in the top of the guiding (1.3 $\mu$m) layers by holographic photolithography and chemical etching, by orienting the gratings along the (011) direction. The gratings are then covered with: 2 $\mu$m of undoped GaAs/GaAlAs (the waveguide layer), GaInP (1.3-$\mu$m wavelength/composition) (the confinement layer) and p-doped GaAs as the cap layer (150 Å). The resulting laser diode exhibits a wavelength of $\lambda$=808 nm, and an energy gap of $E_g$=1.535.

Figure 3:
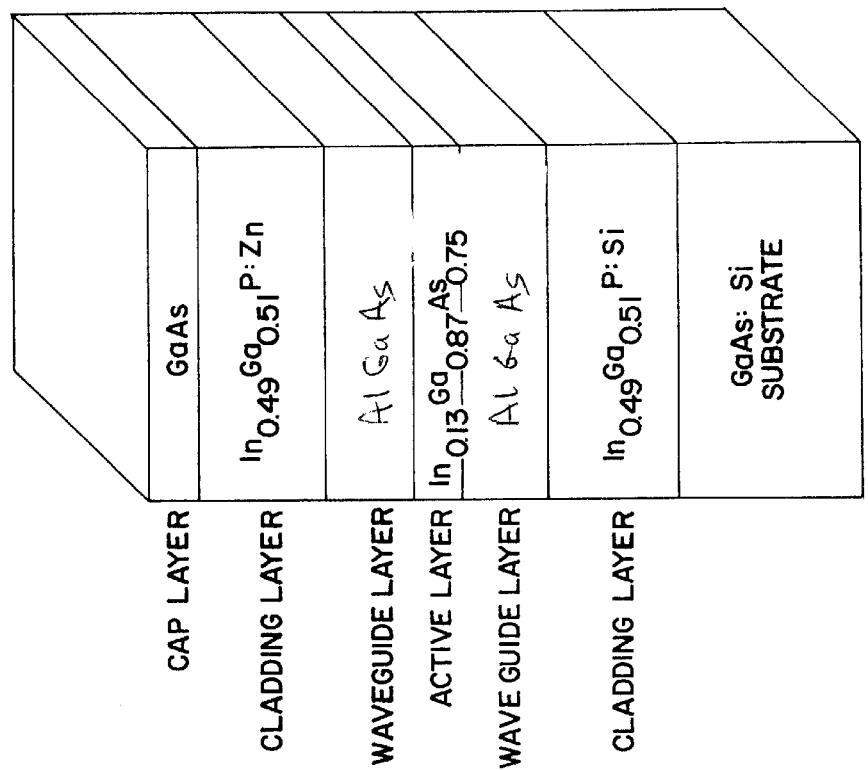
FIG. 3 is a cross-section through a GaAs substrate with an epitaxial laser structure for emission of radiation from 650→1100 nm.

Various other heterostructures are prepared using the procedure set forth above, resulting in a structure such as that set forth in FIG. 3. In these structures, the composition of the active layer is controlled by varying the partial pressures of the source ingredients. The waveguide and other layers are maintained at the compositions set forth in Example 1.

Thus, different compositions of the active layer are prepared as set forth in Table 2 below.

In a similar fashion, diode lasers are prepared having the same substrate, cladding, waveguide, and cap layers. In each, the active layer composition is varied, resulting in different lasing wavelengths. The results are set forth in Table 3 below.

The resulting diode lasers exhibit different wavelengths in the absorption band as set forth in Table 2 and 3. From the Tables, it is clear that the variation of the In/Ga and Ga/Al ratios of the respective layers of the heterostructure results in a concomitant variation in the wavelength of light emitted by the diode laser, most notably from about 650 nanometers to about 1100 nanometers.

Thus, as the ratio of Ga:In varies from about 0.5:0.5 to about 1.0:0 and the ratio of Ga/Al increases from about 0:1.0 to about 1.43, the wavelength increases to from about 650 nm to about 860 nm. Further, with $Ga_xIn_{1-x}As$, and changing x from 1.0 to 0.8, the wavelength can be changed from 840 nm to 1100 nm.

More specifically, the wavelength of the diode laser of the subject invention varies proportionately with the concentration of Ga (and inversely proportional with the In concentration) in the compositional structure. Thus, by the method of the subject invention, the wavelength of a diode laser can be adjusted as desired within the range of 650 nm to 1100 nm.

EXAMPLE 2

A double heterostructure for a diode laser as set forth in FIG. 3 is prepared on a GaAs substrate according to the above methods and in the following manner. First, a 1-$\mu$m thick InGaP layer (n=1×10$^{18}$) cladding layer is grown and doped with Si; a 0.2 micron waveguide layer of AlGaAs, and a 300 Å thick undoped In$_{0.13}$Ga$_{0.87}$As active layer (800 nm wavelength composition), over a 0.2 micron-thick AlGaAs waveguide layer (0.65 micron wavelength composition) are successively grown by LP-MOCVD on a Si-doped (100) 2° off GaAs substrate. Total thickness of the optical cavity is 4300 Å. The growth temperature is 530° C. The above layers are then covered with 1 micron of Zn-doped In$_{0.49}$Ga$_{0.51}$P (the cladding layer) and a 0.1 micron GaAs cap layer with Zn doping of 10$^{20}$ atoms/cm$^3$. p-type doping of the cladding layer is 0.1 micron GaAs cap layer with Zn doping of 10$^{20}$ atoms/cm$^3$. p-type doping of the cladding layer is conducted prior to deposition of the cap layer by directing DEZ at 535° C. into the reactor for about 3 minutes to deposit 5×10$^{17}$ Zn atoms/cm$^3$. After deposition of the cap layer and in order to have a good ohmic contact and to achieve a concentration of 10$^{20}$ Zn atoms/cm$^3$ in the cap layers, the TEG flow is switched off and the temperature is allowed to cool down to room temperature; this takes about 10 minutes. While cooling, the DEZ and arsine flow remain constant. When ambient temperature is reached, the DEZ and arsine flow are turned off. The resulting laser diode exhibits a wavelength of $\lambda$=808 nm. A threshold current density of 400 Å/cm$^2$ with a differential quantum efficiency of 70% is observed.

EXAMPLE 3

Various other heterostructures may be prepared using the procedure set forth above, resulting in a structure such as that set forth in FIG. 3 for Ga$_x$In$_{1-x}$As/GaAs (0$\leq$x$\leq$1) with AlGaAs/GaAs as a waveguide layer. In these structures, the thickness of the optical cavity layers is controlled by varying the length of time of flow of the source ingredients. The structure of FIG. 3 is grown by gas-source MBE to result in the following layers.

1. n$^+$ GaAs substrate.
2. Ga$_{0.94}$In$_{0.51}$P confinement layer doped with Si, S, Ge, Se, or Te.
3. Ga$_x$Al$_{1-x}$As (0$\leq$x$\leq$0.43) GRIN (Graded Index) undoped waveguide.
4. GaAs undoped waveguide (0.1 $\mu$m to 0.4 $\mu$m)
5. active layer; multiquantum well of InAs/GaAs, or In$_x$Ga$_{1-x}$As/GaAs (0.1 $\mu$m to 0.4 $\mu$m).
6. undoped GaAs waveguide (0.1 $\mu$m to 0.4 $\mu$m)
7. undoped Ga$_x$Al$_{1-x}$As (0<x<0.43) waveguide (0.2 $\mu$m to 0.5$\mu$m)
8. p-doped Ga$_{0.94}$In$_{0.51}$P confinement layer (doped with Zn, Be, Cd or Mg) (1 $\mu$m to 2$\mu$m)
9. highly p-doped GaAs cap layer (100 Å–200 Å).

In Examples 4–10, the composition of each layer is maintained at the compositions set forth in Example 2 and different total thicknesses of the optical cavity are prepared as set forth in Table 2 below.

TABLE 2

| Example | Thickness (Å) | Current Density (A/cm$^2$) | Efficiency | p-type Doping (Cap Layer) (atms/cm$^2$) |
|---|---|---|---|---|
| 4 | 9000 | 1000 | 70% | 10$^{20}$ |
| 5 | 8000 | 850 | 70% | 10$^{20}$ |
| 6 | 7000 | 700 | 60% | 10$^{20}$ |
| 7 | 6000 | 600 | 55% | 10$^{20}$ |
| 8 | 5000 | 550 | 50% | 10$^{20}$ |
| 9 | 4500 | 500 | 35% | 10$^{20}$ |
| 10 | 2500 | 450 | 20% | 10$^{20}$ |

The resulting diode lasers exhibit dramatically increased power levels in the 5000 Å–1 micron range as set forth in Table 2. From the above table, it is clear that the saturation p-type doping of the confinement layer and increased thickness of the optical cavity of a double heterostructure SCH-SQW Ga$_x$In$_{1-x}$As/GaAs (0$\leq$x$\leq$1) results in the increased power capabilities of light emitted by the diode laser, including increased efficiency levels.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

I claim:

1. A method for the preparation of a strained layer heterostructure for a diode laser comprising the steps of:
   a) preparing a substrate;
   b) growing the following layers on said substrate:
      1) a first doped cladding layer of GaInP;
      2) two undoped waveguide layers of GaAlAs/GaAs each;
      3) an undoped active layer of Ga$_x$In$_{1-x}$As (0$\leq$x$\leq$1) between said waveguide layers;
      4) a second doped cladding layer of GaInP; and
      5) a cap layer.

2. The method of claim 1 including the step of doping said first cladding layer with Si.

3. The method of claim 1 including the step of doping said second cladding layer with Zn or Be.

4. The method of claim 1 wherein said active layer is varied in composition from about Ga$_{0.50}$In$_{0.50}$As to about Ga$_{0.96}$In$_{0.04}$As.

5. A method for the preparation of strained layer graded index for use in a diode laser comprising the steps of
   a) growing a cladding layer, an undoped waveguide layer of GaAlAs/GaAs different from said cladding layer, an active layer, a second waveguide layer of GaAlAs/GaAs, a second cladding layer different from said second waveguide layer, and a cap layer on said active layer sequentially, wherein first and second cladding layers are formed of GaInP.

6. The method of claim 5 wherein said cladding layers include two doped cladding layers.

7. The method of claim 6 wherein a first cladding layer is doped with Si.

8. The method of claim 5 wherein the composition of said waveguide layer is GaAlAs/GaAs (0$\leq$x$\leq$1) and said wavelength is varied from about 660 nm to about 1100 nm by increasing Ga while decreasing As.

9. The method of claim 5 wherein the composition of said active layer is adjusted to $Ga_{1-x}In_xAs/GaAs$ ($0 \leq x \leq 1$), thereby resulting in a wavelength of from 700 nm to 1100 nm.

10. The method of claim 6 wherein a second cladding layer is doped with Zn or Be.

11. The method of claim 5 wherein said active layer is from 0.1 µm to 0.5 µm.

12. The method of claim 5, further including the step of varying the composition of the active layer from x=0.51 to x=0.82.

13. A method for the preparation of a strained layer heterostructure for a diode laser by LP-MOCVD or gas source MBE comprising the steps of:
   a) preparing a heated substrate;
   b) growing, in succession, the following layers on said substrate by the flow of materials:
      1) a first cladding layer of GaInP;
      2) a first waveguide layer of undoped GaAlAs/GaAs, first
      3) an undoped active layer of a GaInAs/GaAs composition;
      4) a second waveguide layer of undoped GaAlAs/GaAs
      5) a second cladding layer of GaInP,
   c) doping said first and second cladding layers by cooling said substrate and grown layers, terminating the flow of materials; and
   introducing to each of said first and second cladding layer a dopant selected from the group consisting of silane, diethyl zinc, and diethyl beryllium.

14. The method of claim 13 including the step of doping said first cladding layer with Si.

15. The method of claim 13 including the step of doping said second cladding layer with Zn or Be.

16. A method for the preparation of a strained layer heterostructure for a diode laser comprising the steps of:
   a) preparing a substrate;
   b) growing the following layers on said substrate:
      1) a first doped cladding layer of GaInP;
      2) two undoped waveguide layers of GaAlAs/GaAs
      3) an undoped active layer of $Ga_xIn_{1-x}As/GaAs$, where $0 \leq x \leq 1$
      4) a second doped cladding layer of GaInP, and
   c) controlling the thickness of said active layer and said waveguide layers to total between 5000 Å and 1 micron.

17. The method of claim 16 including the step of doping said first cladding layer with Si.

18. The method of claim 16 including the step of doping said second cladding layer with Zn to a concentration of from $5 \times 10^{19}$ atoms/$cm_2$ to $10^{20}$ atoms/$cm^2$ on the surface.

19. A method for the preparation of a GaInAs/GaAs strained layer double heterostructure for use in a diode laser comprising the steps of
   a) growing a first cladding layer;
   b) growing an active layer of GaInAs on a substrate between two waveguides of undoped GaAlAs/GaAs;
   c) controlling the growth of said active layer and said waveguides so that the combined thickness of said layers is between 5000 Å and 1 micron;
   d) growing a second cladding layer; and
   e) doping said second cladding layer with p-type dopant to achieve a saturation of dopant on the surface of said second cladding layer wherein each of said first and second cladding layers are formed of GaInP.

20. The method of claim 19 including doping said first cladding layer with an n-type dopant.

21. The method of claim 19 wherein said first cladding layer is doped with Si.

22. The method of claim 19 wherein said second cladding layer is doped with Zn.

23. The method of claim 19 wherein said active layer is 0.1 µm to 0.5 µm.

24. The method of claim 19 wherein each of said waveguide layers is 0.3–0.5 microns thick.

25. A method for the preparation of a strained layer heterostructure for a diode laser comprising the steps of:
   a) preparing a heated substrate;
   b) growing, in succession, the following layers on said substrate by the controlled flow of trimethyl indium, triethyl gallium, arsine (trimethyl aluminum), and phosphine to said heated substrate:
      1) a first cladding layer of GaInP;
      2) a first waveguide of undoped GaAlAs/GaAs,
      3) an undoped active layer of a $Ga_xIn_{1-x}As/GaAs$ composition ($0 \leq x \leq 1$);
      4) a second waveguide layer of undoped GaAlAs/GaAs; and
      5) a second cladding layer of GaInP, and controlling steps b)2), b)3), and b)4) so that the total thickness of said layers is between 5000 Å and 1 micron,
   c) doping said second cladding layer by:
      1) cooling said substrate and grown layers;
      2) terminating the flow of said trimethyl indium, triethyl gallium, arsine, and phosphine; and
      3) introducing diethyl zinc or diethyl beryllium to said second cap layer for a period of about 2–3 minutes.

26. The method of claim 25 including the step of doping said first cladding layer with Si.

27. A method for the preparation of a strained layer heterostructure for a diode laser comprising the steps of:
   a) preparing a heated substrate;
   b) growing, the following layers on said substrate by the flow of trimethyl indium, triethyl gallium, arsine, and phosphine to said heated substrate:
      1) a first cladding layer of GaInP;
      2) a first waveguide of GaAlAs\GaAs
      3) an undoped active layer of a $Ga_xIn_{1-x}As$\GaAs ($0 \leq x \leq 1$) composition;
      4) a second waveguide of GaAlAs/GaAs; and
      5) a doped second cladding layer of GaInP,
   c) growing a cap layer of GaAs;
   d) doping said cap layer by cooling said substrate and grown layers;
   terminating the flow of said trimethyl indium, triethyl gallium, arsine, and phosphine;
   introducing to said first and second cladding layer a dopant selected from the group consisting of silane and diethyl zinc; and
   e) doping said cap layer with Zn to a level of about $10^{20}$ atoms/$cm^3$.

28. The method of claim 27 wherein said step of growing the cap layer includes introducing a flow of triethyl gallium and arsine on said heated substrate.

29. The method of claim 27 wherein said step of doping said cap layer includes the step of terminating the flow of triethyl gallium and maintaining a flow of diethyl zinc and arsine while cooling said substrate to ambient.

* * * * *